(12) United States Patent
Park

(10) Patent No.: US 9,966,486 B2
(45) Date of Patent: May 8, 2018

(54) SOLAR CELL APPARATUS AND METHOD OF FABRICATING THE SAME

(75) Inventor: Kyung Eun Park, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 306 days.

(21) Appl. No.: 14/123,462

(22) PCT Filed: May 30, 2012

(86) PCT No.: PCT/KR2012/004249
§ 371 (c)(1),
(2), (4) Date: Feb. 24, 2014

(87) PCT Pub. No.: WO2012/165849
PCT Pub. Date: Dec. 6, 2012

(65) Prior Publication Data
US 2014/0196776 A1 Jul. 17, 2014

(30) Foreign Application Priority Data
May 30, 2011 (KR) .................. 10-2011-0051710

(51) Int. Cl.
*H01L 31/0352* (2006.01)
*H01L 31/032* (2006.01)
(Continued)

(52) U.S. Cl.
CPC .. *H01L 31/035281* (2013.01); *H01L 31/0322* (2013.01); *H01L 31/0468* (2014.12); *H01L 31/061* (2013.01); *H01L 31/068* (2013.01); *H01L 31/075* (2013.01); *H01L 31/0749* (2013.01); *H01L 31/1804* (2013.01); *H01L 31/1884* (2013.01); *Y02E 10/541* (2013.01); *Y02E 10/547* (2013.01); *Y02E 10/548* (2013.01); *Y02P 70/521* (2015.11)

(58) Field of Classification Search
CPC ................. H01L 31/035227; H01L 31/035272–31/03529; H01L 31/0322; H01L 31/068; H01L 31/0749; H01L 31/0468
USPC ................................. 136/256, 255
See application file for complete search history.

(56) References Cited

U.S. PATENT DOCUMENTS

| 7,435,996 | B2 * | 10/2008 | Jin ............... | B82Y 20/00 257/40 |
| 7,453,097 | B2 * | 11/2008 | Jin ............... | B82Y 20/00 257/40 |

(Continued)

FOREIGN PATENT DOCUMENTS

| KR | 10-2009-0005872 A | 1/2009 |
| KR | 10-2011-0048724 A | 5/2011 |

OTHER PUBLICATIONS

Machine translation of KR2011-048724, pub. May 2011.*
International Search Report in International Application No. PCT/KR2012/004249, filed May 30, 2012.

*Primary Examiner* — Allison Bourke
(74) *Attorney, Agent, or Firm* — Saliwanchik, Lloyd & Eisenschenk

(57) ABSTRACT

Disclosed are a solar cell apparatus and a method of fabricating the same. The solar cell apparatus includes a substrate, a first electrode layer on the substrate, a plurality of light absorbing columns on the first electrode layer, and a second electrode layer on the light absorbing columns.

9 Claims, 5 Drawing Sheets

(51) Int. Cl.
*H01L 31/068* (2012.01)
*H01L 31/0749* (2012.01)
*H01L 31/075* (2012.01)
*H01L 31/061* (2012.01)
*H01L 31/0468* (2014.01)
*H01L 31/18* (2006.01)

(56) References Cited

U.S. PATENT DOCUMENTS

| | | | |
|---|---|---|---|
| 2006/0207647 A1* | 9/2006 | Tsakalakos | B82Y 20/00 |
| | | | 136/256 |
| 2008/0083963 A1* | 4/2008 | Hsu | H01L 27/1446 |
| | | | 257/431 |
| 2009/0165844 A1* | 7/2009 | Dutta | H01L 31/0296 |
| | | | 136/255 |
| 2009/0194160 A1* | 8/2009 | Chin | H01G 9/20 |
| | | | 136/256 |
| 2010/0078055 A1 | 4/2010 | Vidu et al. | |
| 2010/0193022 A1 | 8/2010 | Hong et al. | |
| 2011/0240099 A1* | 10/2011 | Ellinger | H01L 31/0296 |
| | | | 136/250 |

\* cited by examiner

[Fig. 1]
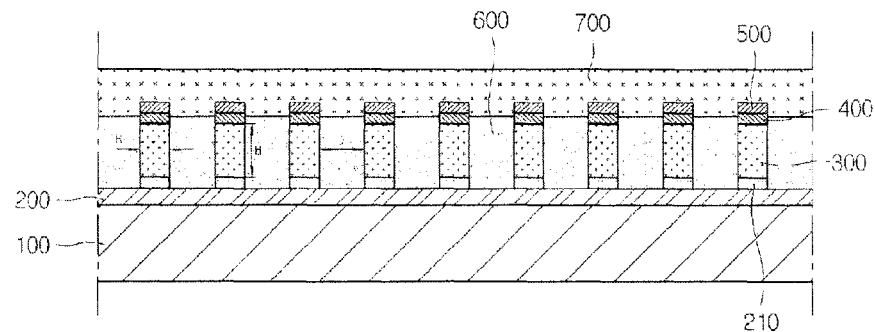
[Fig. 2]
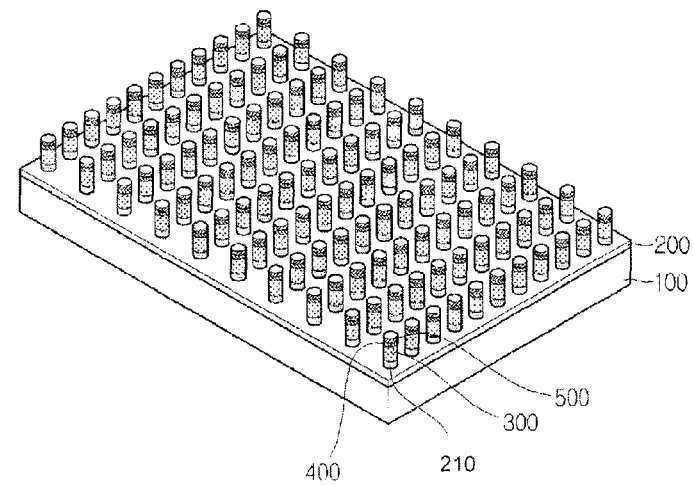
[Fig. 3]
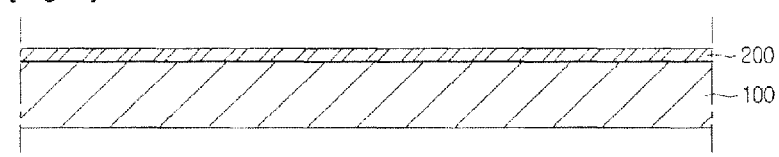
[Fig. 4]
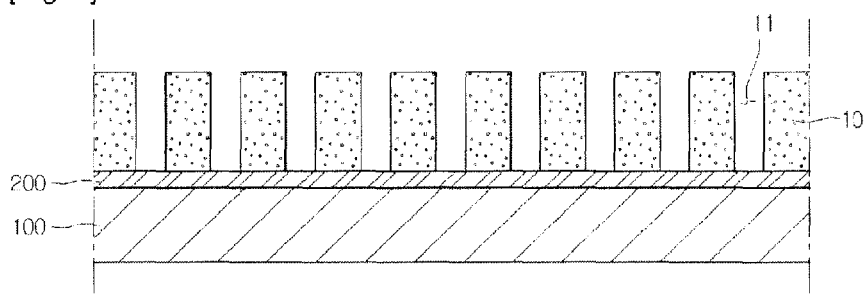

[Fig. 5]
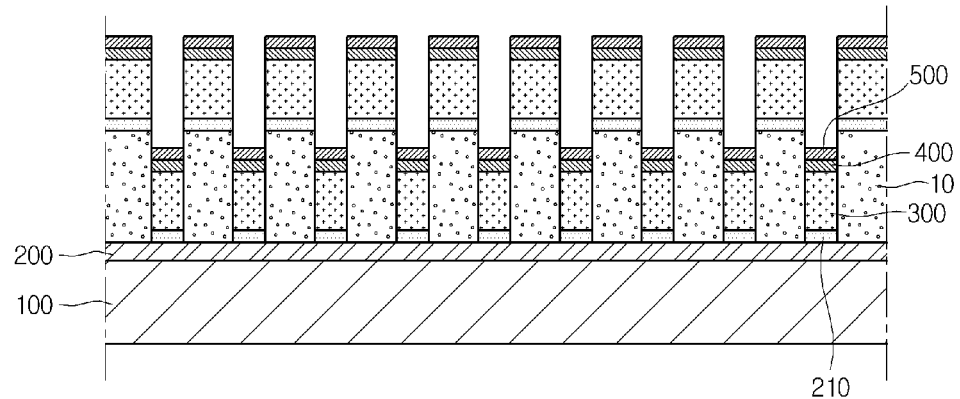
[Fig. 6]
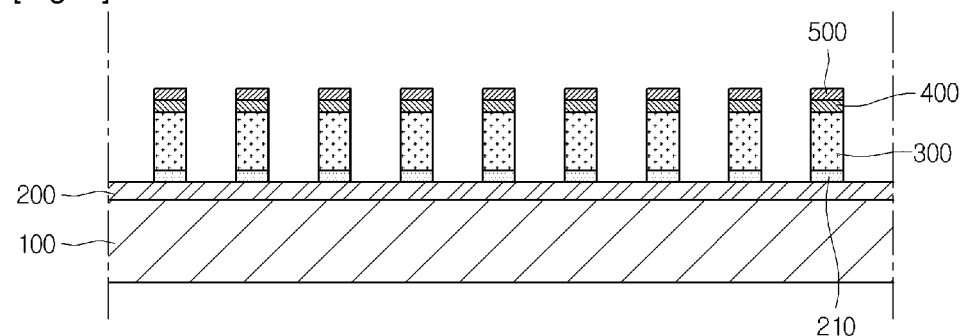
[Fig. 7]
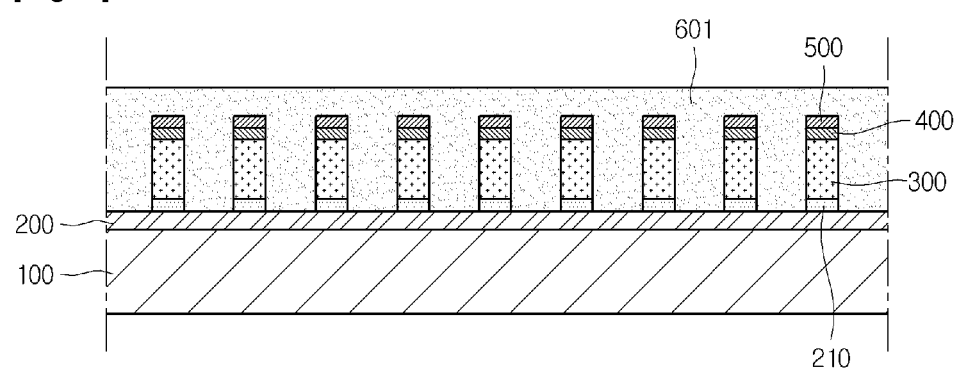
[Fig. 8]
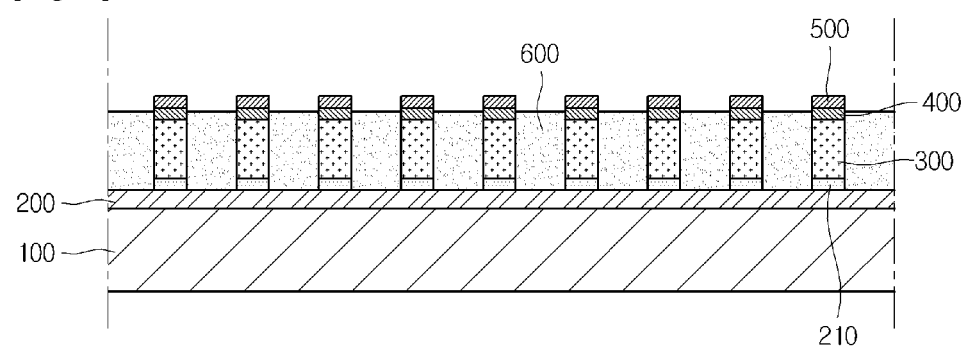

[Fig. 9]
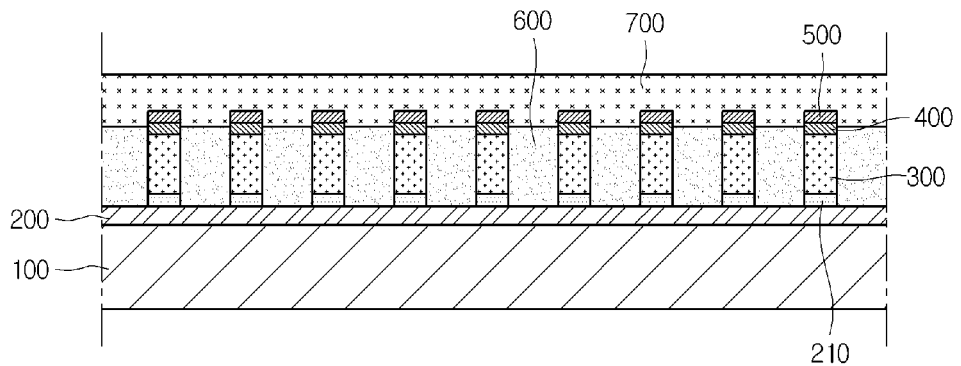
[Fig. 10]
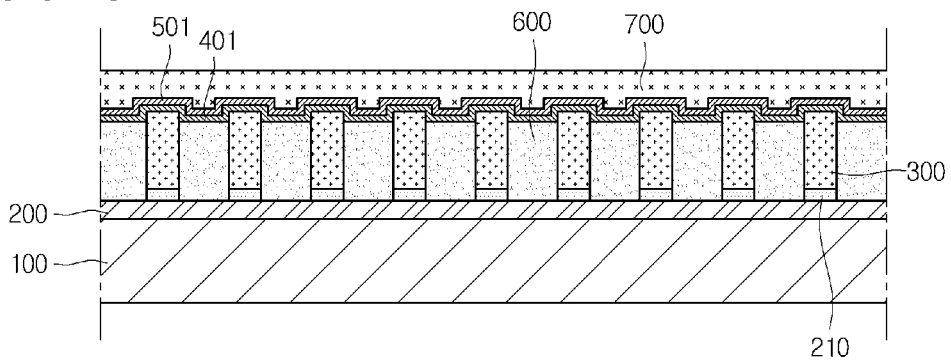
[Fig. 11]
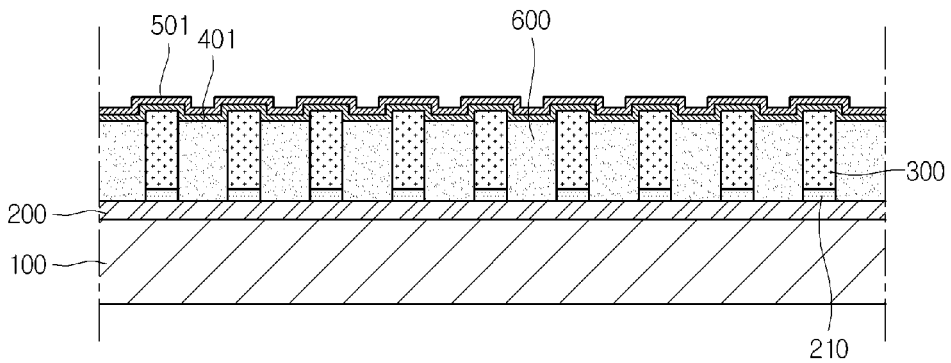
[Fig. 12]
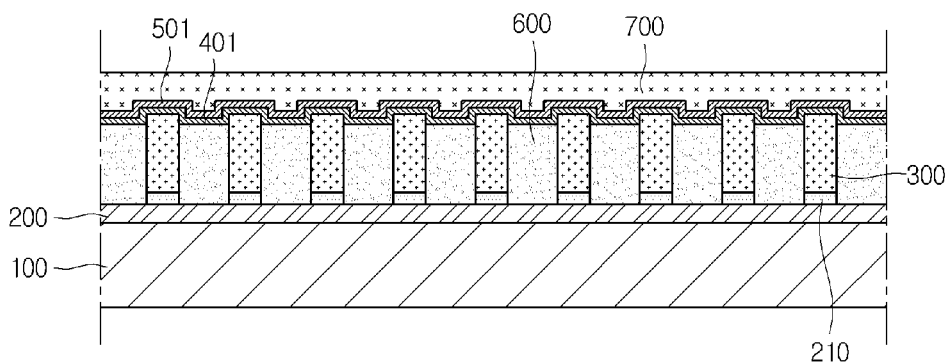

[Fig. 13]
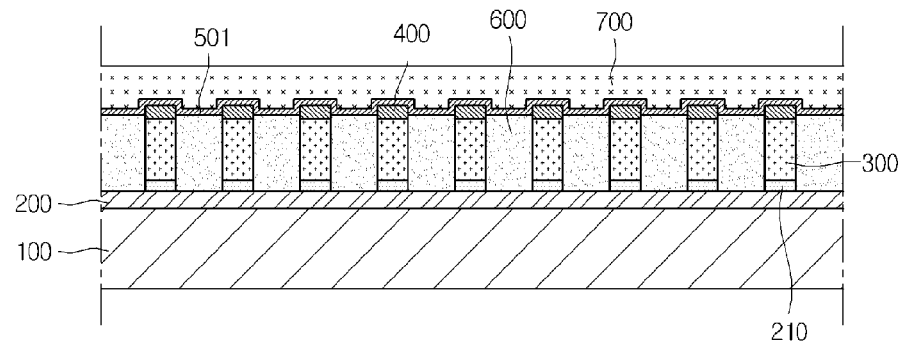
[Fig. 14]
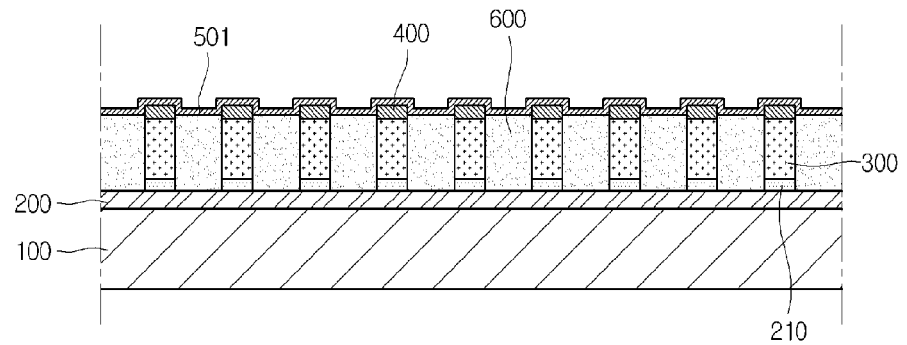
[Fig. 15]
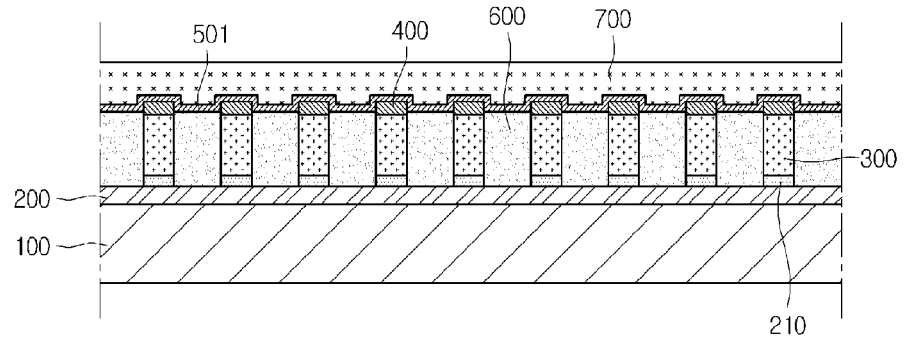
[Fig. 16]
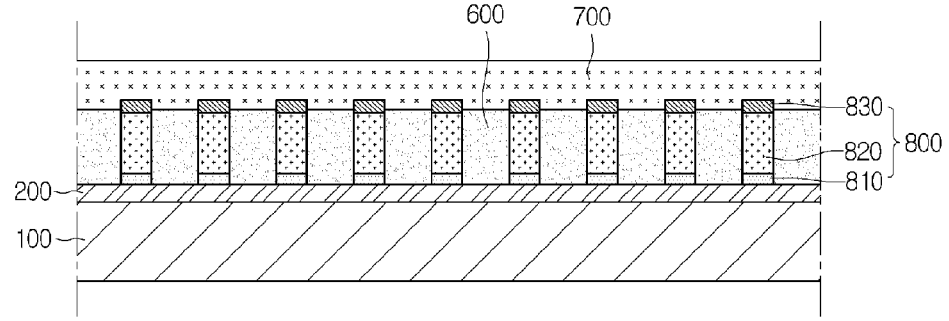
[Fig. 17]
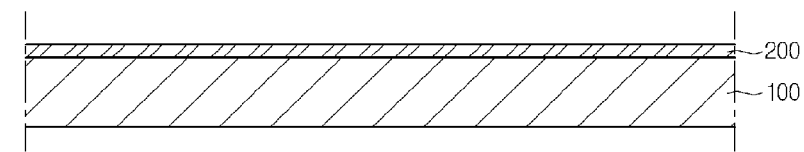

[Fig. 18]
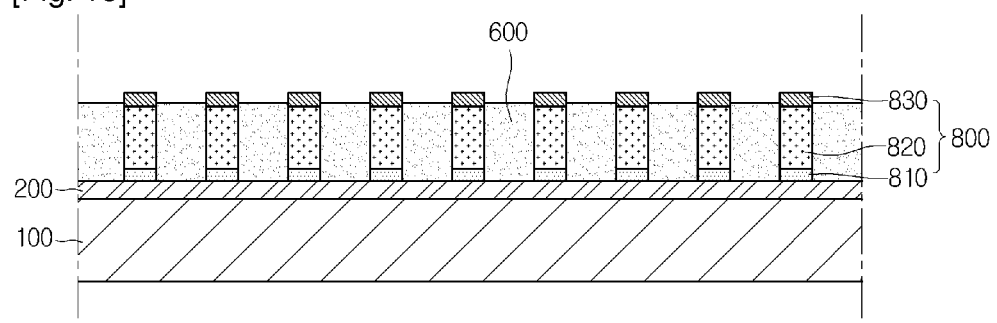
[Fig. 19]
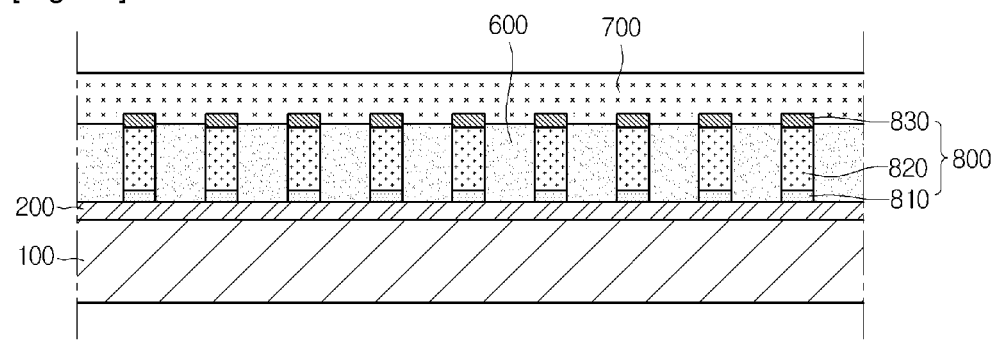

SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/004249, filed May 30, 2012, which claims priority to Korean Application No. 10-2011-0051710, filed May 30, 211, the disclosures of each of which are incorporated herein by reference in their entirety.

TECHNICAL FIELD

The embodiment relates to a solar cell apparatus and a method of fabricating the same.

BACKGROUND ART

Recently, as energy consumption is increased, a solar cell has been developed to convert solar energy into electrical energy.

In particular, a CIGS-based solar cell, which is a PN hetero junction apparatus having a substrate structure including a glass substrate, a metallic back electrode layer, a P type CIGS-based light absorbing layer, a high resistance buffer layer, and an N type window layer, has been extensively used.

DISCLOSURE OF INVENTION

Technical Problem

The embodiment provides a solar cell apparatus which can represent improved photoelectric conversion efficiency and is applicable to windows and doors.

Solution to Problem

According to the embodiment, there is provided a solar cell apparatus including a substrate, a first electrode layer on the substrate, a plurality of light absorbing columns on the first electrode layer, and a second electrode layer on the light absorbing columns.

According to the embodiment, there is provided a method of fabricating a solar cell apparatus. The method includes forming a first electrode layer on a substrate, forming a plurality of light absorbing columns on the first electrode layer, forming a transparent insulating layer between the light absorbing columns, and forming a second electrode layer on the transparent insulating layer and the light absorbing columns.

Advantageous Effects of Invention

As described above, the solar cell apparatus of the embodiment includes a plurality of the light absorbing columns. The light absorbing columns are spaced apart from each other. In particular, the light absorbing columns are too small to be recognized through the visual sense of a person.

Therefore, the solar cell apparatus according to the embodiment can transmit a part of incident light throughout the whole region thereof. In addition, the solar cell apparatus according to the embodiment can absorb light throughout the whole region thereof by the light absorbing columns to convert the light into electrical energy.

Therefore, the solar cell apparatus according to the embodiment can be used as windows or doors of a building. In this case, images such as external landscape can be transmitted throughout the whole solar cell apparatus of the embodiment. In addition, the solar cell apparatus according to the embodiment can generate solar power throughout the whole region thereof.

Therefore, the solar cell apparatus according to the embodiment does not have an additional pattern formed by a transmission region and a non-transmission region. Therefore, the solar cell apparatus of the embodiment may have an improved external appearance.

BRIEF DESCRIPTION OF DRAWINGS

FIG. 1 is a sectional view showing a solar cell apparatus according to a first embodiment;

FIG. 2 is a perspective view showing a light absorbing columns;

FIGS. 3 to 9 are sectional views showing a method of fabricating the solar cell apparatus according to the first embodiment;

FIG. 10 is a sectional view showing a solar cell apparatus according to a second embodiment;

FIGS. 11 and 12 are sectional views showing a method of fabricating the solar cell apparatus according to the second embodiment;

FIG. 13 is a sectional view showing a solar cell apparatus according to a third embodiment;

FIGS. 14 and 15 are sectional views showing a method of fabricating the solar cell apparatus according to the third embodiment;

FIG. 16 is a sectional view showing a solar cell apparatus according to a fourth embodiment; and FIGS. 17 to 19 are sectional views showing a method of fabricating the solar cell apparatus according to the fourth embodiment.

MODE FOR THE INVENTION

In the description of the embodiments, it will be understood that, when a substrate, a layer, a film, a region, or an electrode is referred to as being "on" or "under" another substrate, another layer, another film, another region, or another electrode, it can be "directly" or "indirectly" on the other substrate, the other layer, the other film, the other region, or the other electrode, or one or more intervening layers may also be present. Such a position of each element has been described with reference to the drawings. The thickness and size of each element shown in the drawings may be exaggerated, omitted or schematically drawn for the purpose of convenience or clarity. In addition, the size of elements does not utterly reflect an actual size.

FIG. 1 is a sectional view showing a solar cell apparatus according to a first embodiment, and FIG. 2 is a perspective view showing a light absorbing columns.

Referring to FIGS. 1 and 2, the solar cell apparatus according to the first embodiment includes a support substrate 100, a first electrode layer 200, a plurality of light absorbing columns 300, a transparent insulating layer 600, and a second electrode layer 700.

The support substrate 100 has a plate shape and supports the first electrode layer 200, the plurality of light absorbing columns 300, and the second electrode layer 700. The support substrate 100 may include an insulator. The support substrate 100 may include a glass substrate, a plastic substrate, or a metallic substrate. In more detail, the support substrate 100 may include a soda lime glass substrate. The support substrate 100 may be transparent or may be rigid or flexible.

The first electrode layer 200 is provided on the support substrate 100. The first electrode layer 200 may be formed on the whole top surface of the support substrate 100. The first electrode layer 200 includes a conductive layer 210. In addition, the first electrode layer 200 may be transparent. The first electrode layer 200 may include indium tin oxide or indium zinc oxide. In addition, the first electrode layer 200 may have a thickness of about 0.5 µm to about 1.5 µm.

The light absorbing columns 300 are provided on the first electrode layer 200. The light absorbing columns 300 are electrically connected to the first electrode layer 200. In more detail, the light absorbing columns 300 may directly make contact with the first electrode layer 200.

In addition, a plurality of conductive layers 210 may be interposed between the light absorbing columns 300 and the first electrode layer 200. The conductive layers 210 may include molybdenum (Mo). The conductive layers 210 have the same plane shape as that of the light absorbing columns 300, and may be arranged corresponding to the light absorbing columns 300, respectively. In this case, the first electrode layer 200 and the light absorbing columns 300 may directly make contact with the conductive layer 210. Therefore, the first light absorbing columns 300 may be connected to the first electrode layer 200 through the conductive layers 210.

As shown in FIG. 2, the light absorbing columns 300 extend from the first electrode layer 200 to the second electrode layer 700. The light absorbing columns 300 may vertically extend from the first electrode layer 200 to the second electrode layer 700. In addition, the light absorbing columns 300 may extend from the first electrode layer 200 to the second electrode 700 while being inclined with respect to the first electrode layer 200.

The light absorbing columns 300 extend in one direction. For example, the light absorbing columns 300 may have a column shape. In addition, the light absorbing columns 300 may have a wire shape.

The light absorbing columns 300 has a diameter R in the range of about 10 nm to about 100 µm. In more detail, the diameter R of the light absorbing columns 300 may be in the range of about 100 nm to about 10 µm. The diameter R of the light absorbing columns 300 may be varied according to the total transmittance and an interval D between the light absorbing columns 300.

The light absorbing columns 300 are spaced apart from each other. The interval D between the light absorbing columns 300 may be in the range of about 100 nm to about 100 µm. In more detail, the interval D between the light absorbing columns 300 may be in the range of about 200 nm to about 10 µm. The interval D between the light absorbing columns 300 may be varied according to the diameter R and the total transmittance of the light absorbing columns 300.

A height H of the light absorbing columns 300 may be in the range of about 0.5 µm to about 1.5 µm.

The light absorbing columns 300 are opaque. The light absorbing columns 300 absorb the sunlight that is incident. The light absorbing columns 300 may include a P type compound semiconductor. In more detail, the light absorbing columns 300 may include a group I-III-VI compound semiconductor. For example, the light absorbing columns 300 may have a $Cu(In,Ga)Se_2$ (CIGS) crystal structure, a $Cu(In)Se_2$ crystal structure, or a $Cu(Ga)Se_2$ crystal structure. The light absorbing columns 300 may have an energy bandgap in the range of about 1 eV to about 1.8 eV.

A plurality of buffer layers 400 and a plurality of high resistance buffer layers 500 may be provided on the light absorbing columns 300.

The buffer layers 400 are provided on the light absorbing columns 300. The buffer layers 400 directly make contact with the light absorbing columns 300. The buffer layers 400 have a plane shape corresponding to the light absorbing columns 300, respectively. The buffer layers 400 may be provided corresponding to the light absorbing columns 300, respectively. The buffer layers 400 may include CdS. The buffer layers 400 may have the energy bandgap in the range of about 1.9 eV to about 2.3 eV. In addition, the buffer layers 400 may have a thickness in the range of about 30 nm to about 70 nm.

The high resistance buffer layers 500 are provided on the buffer layers 400. The high resistance buffer layers 500 directly make contact with the buffer layers 400. The high resistance buffer layers 500 have a plane shape corresponding to the buffer layers 400, respectively. The high resistance buffer layers 500 may be provided corresponding to the buffer layers 400, respectively. The high resistance buffer layers 500 may include iZnO which is zinc oxide not doped with impurities. The high resistance buffer layers 500 may have an energy bandgap in the range of about 3.1 eV to about 3.3 eV. The high resistance buffer layers 500 may have a thickness in the range of about 50 nm to about 100 nm.

The transparent insulating layer 600 is provided between the light absorbing columns 300. The transparent insulating layer 600 is provided on the first electrode layer 200. The transparent insulating layer 600 surrounds the light absorbing columns 300. In more detail, the transparent insulating layer 600 may make contact with the lateral side of the light absorbing columns 300.

In addition, the transparent insulating layer 600 may surround the conductive layers 210. In addition, the transparent insulating layer 600 may surround the buffer layers 400 and the high resistance buffer layers 500

The transparent insulating layer 600 is transparent and is an insulator. The transparent insulating layer 600 may include transparent polymer such as acrylic-based resin or epoxy-based resin. The transparent insulating layer 600 may include photo-curable resin.

In addition, the top surface of the transparent insulating layer 600 may be arranged in line with the top surface of the high resistance buffer layers 500, or may be arranged lower than the top surface of the high resistance buffer layers 500. Accordingly, the top surface of the high resistance buffer layers 500 is exposed from the transparent insulating layer 600.

In addition, the top surface of the transparent insulating layer 600 may be provided lower than the top surface of the light absorbing columns 300. Therefore, the light absorbing columns 300 may protrude from the top surface of the transparent insulating layer 600.

The second electrode layer 700 is provided over the light absorbing columns 300. In more detail, the second electrode layer 700 is provided on the high resistance buffer layers 500. In addition, the second electrode layer 700 is provided on the transparent insulating layer 600. The second electrode layer 700 may cover the entire portion of the light absorbing columns 300.

The second electrode layer 700 is connected to the light absorbing columns 300. In more detail, the second electrode layer 700 may be connected to the light absorbing columns 300 through the high resistance buffer layers 500 and the buffer layers 400. In other words, the second electrode layer 700 may directly make contact with the high resistance buffer layers 500.

If the high resistance buffer layers 500 protrude from the transparent insulating layer 600, the high resistance buffer layers 500 may be inserted into the second electrode layer 700. In addition, if the buffer layers 400 protrude from the transparent insulating layer 600, the buffer layers 400 may be inserted into the second electrode layer 700.

In addition, if the light absorbing columns 300 protrude from the transparent insulating layer 600, the light absorbing columns 300 may be inserted into the second electrode layer 700. In this case, the second electrode layer 700 is provided on the light absorbing columns 300 and the lateral side of the light absorbing columns 300. Therefore, the second electrode layer 700 may directly make contact with the lateral side of the light absorbing columns 300.

The second electrode layer 700 is transparent. In addition, the second electrode layer 700 is the conductive layer 210. The second electrode layer 700 may include Al doped zinc oxide (AZO), indium tin oxide (ITO), or indium zinc oxide (IZO). The thickness of the second electrode layer 700 may be in the range of about 1 μm to about 1.5 μm.

The diameter of the light absorbing columns 300 may be too small to be recognized by the visible sense of a person. In addition, the first and second electrode layers 200 and 700 are transparent, so that light can pass through a remaining region except for the light absorbing columns 300.

Therefore, according to the solar cell apparatus of the embodiment, the light may be transmitted throughout the whole region thereof. In addition, the solar cell apparatus of the embodiment may absorb light throughout the whole region thereof to convert the light into electrical energy.

Therefore, the solar cell apparatus according to the embodiment may be applicable to the windows or the doors of a building. In this case, images such as external landscape can be transmitted throughout the whole solar cell apparatus of the embodiment. In addition, the solar cell apparatus according to the embodiment can generate solar power throughout the whole region.

Therefore, the solar cell apparatus according to the embodiment does not have a pattern formed by a transmission region and a non-transmission region. Therefore, the solar cell apparatus of the embodiment may have an improved external appearance.

FIGS. 3 to 9 are sectional views showing the method of fabricating the solar cell apparatus according to the first embodiment. Hereinafter, the method of fabricating the solar cell apparatus will be described by making reference to the above description of the solar cell apparatus. The above description of the solar cell apparatus will be incorporated in the description of the present fabricating method.

Referring to FIG. 3, the first electrode layer 200 is formed on the support substrate 100. The first electrode layer 200 may be formed by depositing transparent conductive material such as indium tin oxide, or indium zinc oxide on the support substrate 100 through a sputtering process.

Referring to FIG. 4, a mask layer 10 is formed on the first electrode layer 200. The mask layer 10 may be formed through an imprinting process or a photolithography process. The mask layer 10 may be formed therein with a plurality of through holes 11 to expose the top surface of the first electrode layer 200. The diameter of the through holes 11 and the interval between the through holes 11 may be varied according to the diameter of the light absorbing columns 300 to be formed and the interval between the light absorbing columns 300.

Referring to FIG. 5, a metal such as molybdenum is deposited on the mask layer 10 and in the through holes 11. Therefore, the conductive layers 210 are formed in the through holes 11.

Thereafter, the light absorbing columns 300 are formed in the through holes 11, respectively. The light absorbing columns 300 may be formed through a sputtering process or an evaporation scheme.

In detail, the light absorbing columns 300 may be formed through various schemes such as a scheme of forming a Cu(In,Ga)Se2 (CIGS) based light absorbing columns 300 by simultaneously or separately evaporating Cu, In, Ga, and Se and a scheme of performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, or a Ga target.

Thereafter, the metallic precursor layer is subject to the selenization process so that the metallic precursor layer is converted into the Cu(In, Ga)Se2 (CIGS) based compound semiconductor.

In addition, the sputtering process employing the Cu target, the In target, and the Ga target and the selenization process may be simultaneously performed.

Further, a CIS or a CIG based compound semiconductor may be formed through the sputtering process employing only Cu and In targets or only Cu and Ga targets and the selenization process.

Therefore, the light absorbing columns 300 are formed by depositing a group I-III-VI compound semiconductor in the through holes 11.

Thereafter, the buffer layers 400 are formed on the light absorbing columns 300. The buffer layers 400 may be formed through a chemical bath deposition (CBD). For example, after forming the light absorbing columns 300, the light absorbing columns 300 and the mask layer 10 are immersed in a solution including materials to form CdS, so that the buffer layers 400 including the CdS are formed on the light absorbing columns 300.

hereafter, the high resistance buffer layers 500 are formed on the buffer layers 400. The high resistance buffer layers 500 may be formed through a sputtering process employing an iZnO target which is not doped with impurities. In other words, the high resistance buffer layers 500 may be formed in the through holes 11, respectively, by depositing zinc oxide on the mask layer 10 and in the through holes 11.

Thereafter, the mask layer 10 is removed. When the mask layer 10 is removed, the metal, the group I-III-VI-based compound semiconductor, CdS, and zinc oxide deposited on the mask layer 10 may be automatically removed.

Referring to FIG. 7, a resin composition is coated on the first electrode layer 200. The resin composition may cover the light absorbing columns 300. The resin composition may be coated on the first electrode layer 200 through a spin coating scheme, a spray coating scheme, or a slit coating scheme. The resin composition may include thermosetting resin and/or photo-curable resin.

Thereafter, the coated resin composition may be cured by light and/or heat. Accordingly, a preliminary transparent insulating layer 601 is formed on the first electrode layer 200. The preliminary transparent insulating layer 601 may cover the light absorbing columns 300. In more detail, the preliminary transparent insulating layer 601 may cover the high resistance buffer layers 500. Therefore, the top surface of the high resistance buffer layers 500 may be provided in the preliminary transparent insulating layer 601.

Referring to FIG. 8, the transparent insulating layer 600 is formed by etching a part of the preliminary transparent insulating layer 601. Therefore, the top surface of the high resistance buffer layers 500 may be exposed from the transparent insulating layer 600. The buffer layers 400 and the light absorbing columns 300 may be exposed from the transparent insulating layer 600 according to the etching degree of the preliminary transparent insulating layer 601.

Different from FIGS. 7 and 8, the resin composition may be coated on the first electrode layer 200 in such a manner that the top surface of the high resistance buffer layers 500 is exposed. In this case, the etching process shown in FIG. 8 is not required.

Referring to FIG. 9, the second electrode layer 700 is formed by depositing transparent conductive material on the transparent insulating layer 600 and the high resistance buffer layers 500. For example, the second electrode layer 700 may be formed by depositing transparent conductive material such as Al doped zinc oxide (AZO), indium tin oxide (ITO), or indium zinc oxide (IZO).

As described above, the solar cell apparatus can be easily fabricated while representing the transmission region throughout the whole region of the solar cell apparatus and improved photoelectric conversion efficiency.

FIG. 10 is a sectional view showing a solar cell apparatus according to a second embodiment, and FIGS. 11 and 12 are sectional views showing a method of fabricating the solar cell apparatus according to the second embodiment. FIG. 13 is a sectional view showing a solar cell apparatus according to a third embodiment, and FIGS. 14 and 15 are sectional views showing a method of fabricating the solar cell apparatus according to the third embodiment. Hereinafter, the second and third embodiments will be described by making reference to the above description of the solar cell apparatus and the method of fabricating the same. The above description of the solar cell apparatus and the method of fabricating the same will be incorporated in the description of the second and third embodiments except for essential parts.

Referring to FIG. 10, a buffer layer 401 is provided on the transparent insulating layer 600 and the light absorbing columns 300. In more detail, the buffer layer 401 covers the transparent insulating layer 600 and the light absorbing columns 300. In other words, the buffer layer 401 is formed on the top surface of the transparent insulating layer 600. In more detail, the buffer layer 401 is coated on the top surface of the transparent insulating layer 600 and the top surface of the light absorbing columns 300.

The solar cell apparatus according to the present embodiment may be fabricated through the following process.

Referring to FIG. 11, after forming the light absorbing columns 300, the transparent insulating layer 600 is formed. In other words, after forming the light absorbing columns 300 by the mask layer, the mask layer is removed, and the transparent insulating layer 600 is directly formed.

The buffer layer 401 and the high resistance buffer layer 501 are sequentially formed on the transparent insulating layer 600 and the light absorbing columns 300 through a deposition process.

Referring to FIG. 12, the second electrode layer 700 is formed by depositing the transparent conductive material on the high resistance buffer layer 501.

As described above, the buffer layer 401 and the high resistance buffer layer 501 may be formed on the entire portion of the transparent insulating layer 600 and the light absorbing columns 300.

Referring to FIG. 13, the buffer layers 400 are provided on the light absorbing columns, respectively. In addition, the high resistance buffer layer 501 is provided on the transparent insulating layer 600 and the buffer layers 400. In other words, the high resistance buffer layer 501 is directly provided on the top surface of the transparent insulating layer 600 to cover the buffer layers 400.

The solar cell apparatus according to the present embodiment may be fabricated through the following process.

Referring to FIG. 14, after forming the light absorbing columns 300 and the buffer layers 400, the transparent insulating layer 600 is formed. In other words, after forming the light absorbing columns 300 and the buffer layers 400 by the mask layer 10, the mask layer 10 is instantly removed. Thereafter, the transparent insulating layer 600 is formed.

Next, the high resistance buffer layer 501 is formed on the transparent insulating layer 600 and the buffer layers 400 through a deposition process.

Referring to FIG. 15, the second electrode layer 700 is formed by depositing the transparent conductive material on the high resistance buffer layer 501.

As described above, the high resistance buffer layer 501 may be formed throughout the entire portion of the transparent insulating layer 600 and the buffer layers 400.

FIG. 16 is a sectional view showing a solar cell apparatus according to a fourth embodiment, and FIGS. 17 to 19 are sectional views showing a method of fabricating the solar cell apparatus according to the fourth embodiment. Hereinafter, the present embodiment will be described by making reference to the above description of the solar cell apparatus and the method of fabricating the same. The above description of the solar cell apparatus and the method of fabricating the same will be incorporated in the description of the present embodiment except for essential parts.

Referring to FIG. 16, light absorbing columns 800 may include silicon. In more detail, the entire portion of the light absorbing columns 800 may include silicon. In other words, the light absorbing columns 800 may have a silicon-based P-N junction structure or a silicon-based P-I-N junction structure. The light absorbing columns 800 include a first conductive part 810, a second conductive part 820, and a third conductive part 830.

The first conductive part 810 is provided on the first electrode layer 200. The first conductive part 810 may be directly connected to the first electrode layer 200, or may be connected to the first electrode layer 200 through the conductive layers 210. The first conductive part 810 has a first conductive type. For example, the first conductive part 810 may have a P type conductive type. In more detail, the first conductive part 810 may be doped with P type impurities. For example, the first conductive part 810 may include silicon doped with P type impurities. The P type impurities may include aluminum (Al), gallium (Ga), or indium (In).

The second conductive part 820 is provided on the first conductive part 810. The second conductive part 820 may be integrally formed with the first conductive part 810. The second conductive part 820 may have an I type conductive type. In other words, the second conductive part 820 may be not doped with impurities. For example, the second conductive part 820 may include silicon that is not doped with impurities.

The third conductive part 830 is provided over the first conductive part 810. In addition, the third conductive part 830 is provided on the second conductive part 820. The third conductive part 830 may directly make contact with the second conductive part 820. The third conductive part 830 has a second conductive type. For example, the third conductive part 830 may have an N type conductive type. In more detail, the third conductive part 830 may be doped with N type impurities. For example, the third conductive part 830 may include silicon doped with N type impurities. The N type impurities may include phosphorus (P), nitrogen (N), or arsenic (As).

In addition, the light absorbing columns 800 are connected to the second electrode layer 700. In more detail, the light absorbing columns 800 may be directly connected to the second electrode layer 700. The top surface of the light absorbing columns 800 may directly make contact with the second electrode layer 700. In more detail, the third conductive part 830 may be directly connected to the second electrode layer 700.

The solar cell apparatus according to the present embodiment will be fabricated through the following process.

Referring to FIG. 17, the first electrode layer 200 is formed on the support substrate 100.

Thereafter, a mask layer including a plurality of through holes is formed on the first electrode layer 200.

Silicon doped with P type impurities, silicon that is not doped with impurities, and silicon doped with N type impurities may be sequentially deposited on the top surface of the mask layer 10 and inside the through holes.

In addition, after depositing aluminum (Al) on the top surface of the mask layer and in the through holes, silicon doped with P type impurities may be deposited.

Referring to FIG. 18, after removing the mask layer, the transparent insulating layer 600 is formed between the light absorbing columns 800. Thereafter, the second electrode layer 700 is formed by depositing transparent conductive material on the transparent insulating layer 600 and the light absorbing columns 800.

As described above, the solar cell apparatus according to the present embodiment can transmit light throughout the whole region thereof by using the silicon-based light absorbing columns 800.

Any reference in this specification to "one embodiment," "an embodiment" "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
a substrate;
a first electrode layer on the substrate;
a plurality of molybdenum (Mo) layers on the first electrode layer;
a plurality of light absorbing columns on the Mo layers, respectively;
a plurality of buffer layers on the light absorbing columns, respectively;
a plurality of high resistance buffer layers on the buffer layers, respectively;
a second electrode layer on the light absorbing columns, the buffer layers, and the high resistance buffer layers; and
a transparent insulating layer interposed between the Mo layers, between the light absorbing columns, and between the buffer layers;
wherein each of the light absorbing columns has a diameter in a range of 10 nm to 100 μm,
wherein the transparent insulating layer surrounds the Mo layers, the light absorbing columns, and the buffer layers,
wherein the transparent insulating layer makes contact with a top surface of the first electrode layer, a lateral side of each Mo layer, a lateral side of each light absorbing column, and a lateral side of each buffer layer,
wherein a top surface of the transparent insulating layer is arranged lower than a top surface of the buffer layer and a top surface of the high resistance buffer layer,
wherein the high resistance buffer layer does not directly physically contact the transparent insulating layer,
wherein the buffer layers and the high resistance buffer layers are inserted into the second electrode layer,
wherein the second electrode layer makes contact with the lateral side of each buffer layer, the top surface of each high resistance buffer layer, and a lateral side of each high resistance buffer layer;
wherein the second electrode layer includes one selected from the group consisting of Al doped zinc oxide (AZO), indium tin oxide (ITO), and indium zinc oxide (IZO),
wherein the buffer layers include CdS, and
wherein the high resistance buffer layers include i-ZnO, which is zinc oxide not doped with impurities.

2. The solar cell apparatus of claim 1, wherein the first and second electrode layers are transparent.

3. The solar cell apparatus of claim 1, wherein the first electrode layer includes one selected from the group consisting of Al doped zinc oxide (AZO), indium tin oxide (ITO), and indium zinc oxide (IZO).

4. The solar cell apparatus of claim 1, wherein the light absorbing columns are spaced apart from each other.

5. The solar cell apparatus of claim 1, wherein the transparent insulating layer includes polymer.

6. The solar cell apparatus of claim 4, wherein an interval between the light absorbing columns is in a range of from 100 nm to 100 μm.

7. The solar cell apparatus of claim 1, wherein the buffer layers have a thickness in a range of from 30 nm to 70 nm.

8. The solar cell apparatus of claim 7, wherein the high resistance buffer layers have a thickness in a range of from 50 nm to 100 nm.

9. The solar cell apparatus of claim 8, wherein the second electrode layer has a thickness in a range of from 1 μm to 1.5 μm.

* * * * *